(12) United States Patent
Sakamoto

(10) Patent No.: US 6,288,923 B1
(45) Date of Patent: Sep. 11, 2001

(54) SEMICONDUCTOR MEMORY MOUNTED WITH CACHE MEMORY

(75) Inventor: Yoshihiro Sakamoto, Kamakura (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/661,552

(22) Filed: Sep. 14, 2000

(30) Foreign Application Priority Data

Sep. 14, 1999 (JP) .................................. 11-260699

(51) Int. Cl.[7] .............................. G11C 15/00; G06F 12/00
(52) U.S. Cl. ................................. 365/49; 365/233; 711/3; 711/118
(58) Field of Search ...................... 365/49, 189.04, 365/189.07, 233; 711/3, 118, 123, 128

(56) References Cited

U.S. PATENT DOCUMENTS

| | | | |
|---|---|---|---|
| 5,226,009 | * 7/1993 | Arimoto . | |
| 5,586,279 | * 12/1996 | Pardo et al. | 711/3 |
| 5,845,324 | * 12/1998 | White et al. | 711/128 |
| 6,101,146 | * 8/2000 | Maesako et al. | 365/230.03 |
| 6,201,724 | * 3/2001 | Ishizaki et al. | 365/49 |

OTHER PUBLICATIONS

MOS Memory (SRAM) Data Book of Toshiba, TC55V2377BFF-275-300, pp. 370-387, (Sep. 1999).

* cited by examiner

*Primary Examiner*—Son Mai
(74) *Attorney, Agent, or Firm*—Finnegan, Henderson, Farabow, Garrett, & Dunner, L.L.P.

(57) ABSTRACT

A semiconductor integrated circuit device includes a synchronous burst memory circuit section capable of performing an address pipeline operation and a register array section constituting a cache memory in an address space of the memory circuit section. The register array section includes a tag register array and a data register array. Address signals, which are to be supplied to a memory cell array in the memory circuit section, are distributed to a tag address and a cache address of the tag register array. The cache address is supplied to the data register array.

13 Claims, 9 Drawing Sheets

(WRITE)

FIG. 5A

FIG. 5B (READ)

SEMICONDUCTOR MEMORY MOUNTED WITH CACHE MEMORY

CROSS-REFERENCE TO RELATED APPLICATIONS

This application is based upon and claims the benefit of priority from the prior Japanese Patent Application No. 11-260699, filed Sep. 14, 1999, the entire contents of which are incorporated herein by reference.

BACKGROUND OF THE INVENTION

The present invention relates to a semiconductor memory and, more specifically, to a high-speed circuit of a synchronous burst memory capable of performing an address pipeline operation, which is applied to a synchronous pipelined burst static random access memory (PBSRAM) and cache-mounted dynamic random access memory (DRAM).

In a prior art PBSRAM, an address is decoded in synchronization with a clock signal in read mode, a very small potential is read out of a memory cell selected by the decoded address and amplified through a sense amplifier, and data of the sense amplifier is transferred to an output register.

Addresses are generated in sequence based on an input address using a given method such as a linear method and an interleaving method. A series of data items (e.g., four data items) read out from a memory cell corresponding to a series of addresses is output from an output register.

The PBSRAM has the feature that the first access time period of the first access required until the first data read out of a memory cell of the first-designated address is output is longer than the second to fourth access time periods of the second to fourth accesses required until the second to fourth data read out of memory cells of the second address et seq.

Figure 1:
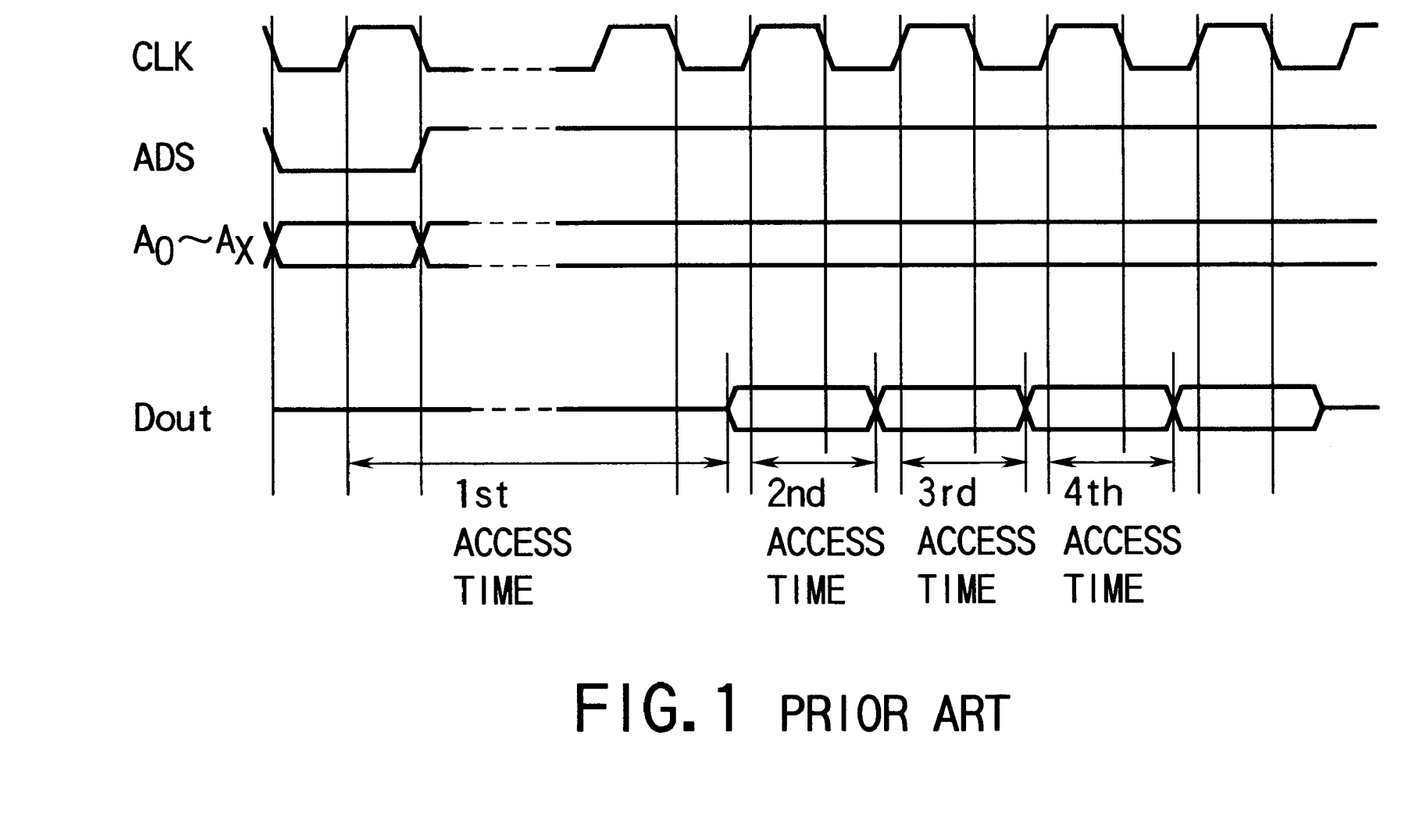
FIG. 1 is a timing chart showing a read operation of a prior art PBSRAM.

FIG. 1 shows an example of timing of the prior art PBSRAM in read mode.

As shown in FIG. 1, the second to fourth access time periods each correspond to two clocks necessary for outputting data from the output register, whereas the first access time period requires extra time corresponding to clocks (the number of which is α) necessary for decoding an address, amplifying a very small potential read out of a selected memory cell by the sense amplifier, and transferring data to the output register.

The number of clocks necessary for satisfying the first access is referred to as read latency. In the prior art PBSRAM, the read latency is long. Since the read latency is expressed by 2 clocks+α, it is 4 when α is 2.

The above-described prior art synchronous burst memory capable of performing an address pipeline operation cannot be increased in speed since the read latency is long.

BRIEF SUMMARY OF THE INVENTION

The present invention has been developed in order to resolve the above problem and its object is to provide a semiconductor memory which is suitably used as a high-speed cache memory and capable of improving the efficiency of use of a data bus by shortening the read latency in a synchronous burst memory capable of performing an address pipeline operation.

A semiconductor integrated circuit device according to the present invention, comprises a synchronous burst memory circuit section capable of performing an address pipeline operation, and a register array section constituting a cache memory in an address space of the synchronous burst memory circuit section, the register array section including a tag register array and a data register array, address signals, which are to be supplied to a memory cell array in the synchronous burst memory circuit section, being distributed to a tag address and a cache address of the tag register array, and the cache address is supplied to the data register array.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will now be described in detail with reference to the accompanying drawings.

Figure 2:
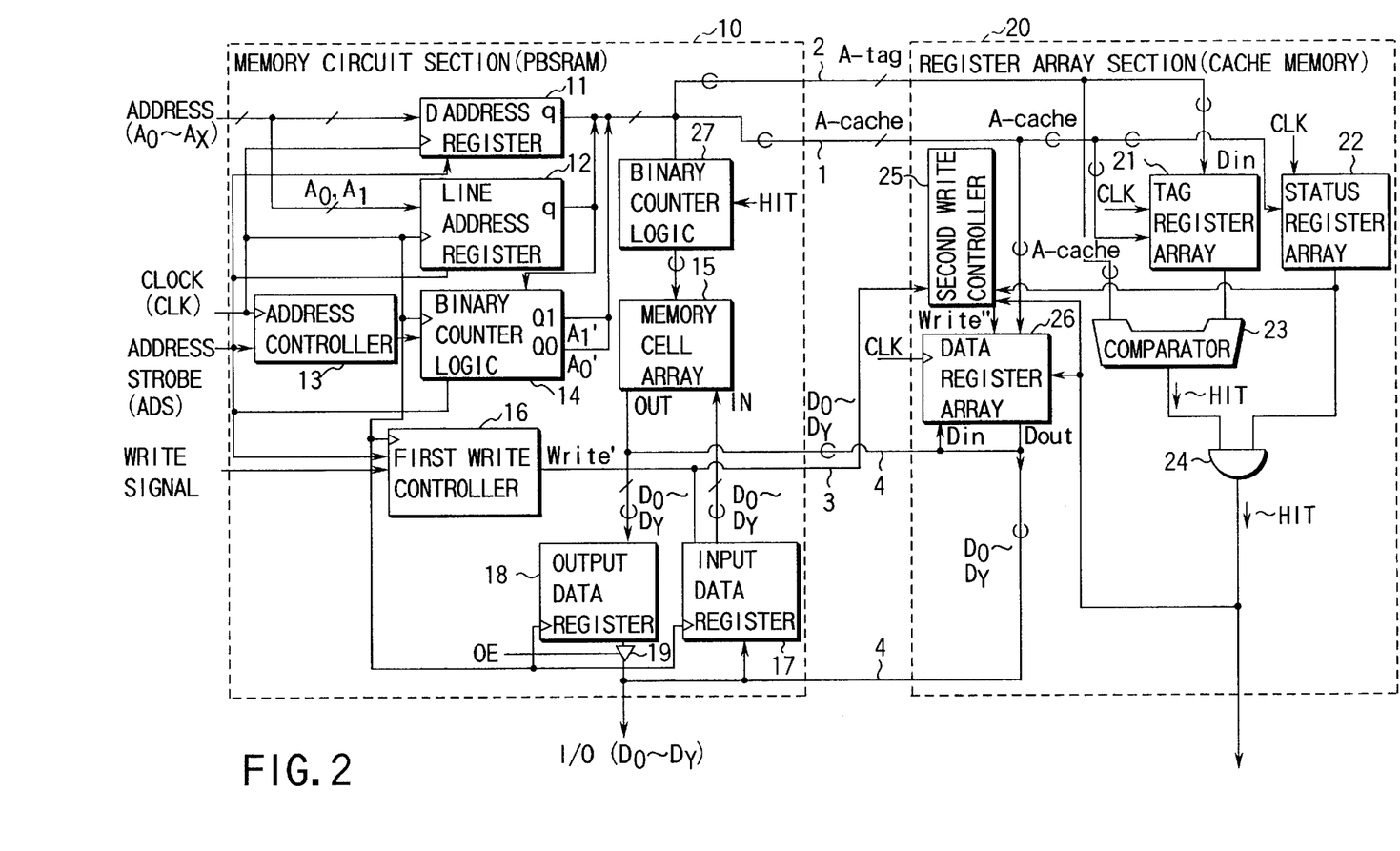
FIG. 2 is a block diagram showing an example of a PBSRAM according to an embodiment of the present invention.

FIG. 2 illustrates a PBSRAM (pipelined burst SRAM) as a semiconductor memory according to an embodiment of the present invention. The PBSRAM is connected to a CPU (not shown) or a cache controller (not shown) and employed as a data memory of a cache memory controlled by the cache controller.

As illustrated in FIG. 2, the PBSRAM includes a synchronous burst memory circuit section (hereinafter referred to as a memory circuit section) 10 and a register array section 20. The memory circuit section 10 is capable of carrying out an address pipeline operation and has the same arrangement as that of the prior art PBSRAM. The register array section 20 constitutes a cache memory in an address space of the memory circuit section 10.

Memory Circuit Section 10

The memory circuit section 10 receives address signals $A_0$ to $A_X$, an address strobe signal ADS, a write signal WRITE, an output enable signal OE, and a clock signal CLK from outside. In response to these signals, the section 10 inputs/outputs input/output data (I/O) $D_0$ to $D_y$.

The memory circuit section 10 includes an address register 11, a line address register 12, an address controller 13, a binary counter logic 14, a memory cell array 15, a first write controller 16, an input data register 17, an output data register 18, and an output buffer 19.

The address register 11 stores some of the address signals $A_0$ to $A_X$, e.g., higher-order bits $A_2$ to $A_X$ in synchronism with the clock signal CLK.

The line address register 12 stores some of the address signals $A_0$ to $A_X$, e.g., lower-order bits $A_0$ and $A_1$ in synchronism with the clock signal CLK.

The address controller 13 receives the address strobe signal ADS in synchronization with the clock signal CLK and outputs a control signal.

The binary counter logic 14 is controlled by the address controller 13 to generate burst address bits $A_0'$ and $A_1'$ on the basis of the lower-order bits $A_0$ and $A_1$ stored in the line address register 12.

In the memory circuit section 10, the higher-order bits $A_2$ to $A_X$ stored in the address register 11 and the lower-order bits $A_0$ and $A_1$ stored in the line address register 12 or the burst address bits $A_0'$ and $A_1'$ generated by the binary counter logic 14 are combined into internal address signals $A_0'$ to $A_X$ which vary continuously. These signals $A_0'$ to $A_X$ are supplied to the memory cell array 15 in which SRAM cells are arranged in rows and columns, via a second binary counter logic 27.

The first write controller 16 receives the write signal WRITE in synchronization with the clock signal CLK and outputs a memory write control signal WRITE'.

The input data register 17 is controlled by the first write controller 16 to store input data $D_0$ to $D_y$ and supply them to the memory cell array 15 in synchronism with the clock signal CLK when the control signal WRITE' is active.

The output data register 18 stores data, which is read out of the memory cell array 15, in synchronism with the clock signal CLK.

The output buffer 19 outputs output data $D_0$ to $D_y$ from the output data register 18 when the output enable signal OE is active.

Figure 3:
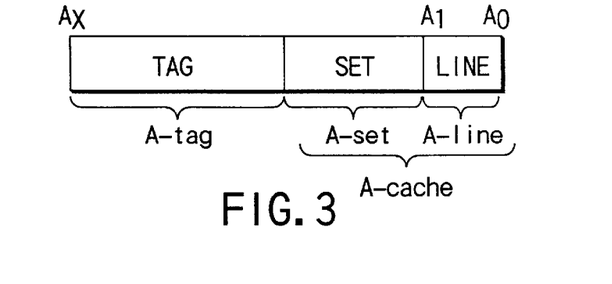
FIG. 3 is a view showing a bit configuration of an internal address signal.

The internal address signals $A_0'$ to $A_X$, which are to be supplied to the memory cell array 15, are distributed to a cache address A-cache and a tag address A-tag, as shown in FIG. 3. The cache address A-cache contains lower-order 2 bits of the internal signals $A_0'$ to $A_X$ (line address: A-line) and their higher-order several bits (set address: A-set), while the tag address A-tag contains the remaining higher-order bits.

The internal address signals $A_0'$ to $A_X$ distributed to the cache address A-cache and tag address A-tag, are supplied to the register array section 20. The section 20 is connected to the memory circuit section 10 via a cache address bus 1, a tag address bus 2, a write control signal line 3, and a data bus 4.

Register Array Section 20

The register array section 20 receives the cache address A-cache, tag-address A-tag, and write control signal WRITE' from the memory circuit section 10 via the cache address bus 1, tag address bus 2, and write control signal line 3, respectively. In response to these signals, the section 20 inputs/outputs I/O data $D_0$ to $D_y$ through the data bus 4.

The register array section 20 includes a tag register array 21, a status register array 22, a comparison circuit 23, a hit signal generation circuit 24, a second write controller 25, and a data register array 26.

In synchronization with the clock signal CLK, the tag register array 21 writes the tag address A-tag as data, using the cache address A-cache as an address input, and outputs the data.

The status register array 22 receives the cache address A-cache in synchronization with the clock signal CLK. The status register array 22 stores status information in correspondence with the cache address A-cache and outputs status information corresponding to the input cache address A-cache. The status information is, for example, information representing a write inhibit address of the memory cell array 15. The status information can be supplied to the status register array 22 from outside and stored therein, or the status register array 22 can be programmed with the status information using a logic circuit.

The comparison circuit 23 compares the tag address A-tag with data (written tag address) read out of the tag register array 21 based on the cache address A-cache to determine whether they coincide (HIT) or not (MISS). When they coincide with each other, the circuit 23 generates a hit signal HIT.

A gate circuit 24 ANDs an output of the comparison circuit 23 and status information output from the status register array 22 to determine whether the hit signal HIT is effective or invalid.

The second write controller 25 generates a cache write control signal WRITE" in response to the write control signal WRITE', the hit signal HIT, and the output of the status register array 22. In the write operation of the PBSRAM shown in FIG. 2, when the second write controller 25 writes data to the data register array 26 and the memory cell array 15 simultaneously, it generates the cache write control signal WRITE" based on the write control signal WRITE'. In the read operation of the PBSRAM shown in FIG. 2, when the second write controller 25 writes data, which is read out of the memory cell array 15, to the data register array 26 at the miss time, it generates the cache write control signal WRITE" based on the AND of the hit signal HIT and the output of the status register array 22.

An address of the data register array 26 is selected by the cache address A-cache, the output thereof is controlled by the hit signal HIT, and the writing thereof is controlled by the cache write control signal WRITE".

The hit signal HIT output from the gate circuit 24, is also supplied to a memory circuit section 10 and input to a second binary counter 27.

The second binary counter 27 increments input internal address signals $A_0'$ to $A_X$ in response to the hit signal HIT.

For example, when one data item is output from the data register array 26 and then the remaining data items are output from the memory cell array 15, the second binary counter 27 increments the internal address signals $A_0'$ to $A_X'$ by one. When two data items are output from the data register array 26 and the remaining data items are output from the memory cell array 15, the second binary counter 27 increments the internal address signals $A_0'$ to $A_X'$ by two. More specifically, the second binary counter 27 increments an input address in accordance with a difference between the read latency of the synchronous burst memory circuit section 10 and that of the register array section 20. The second binary counter 27 thus prevents the same data from being output from both the data register array 26 and memory cell array 15.

Data Register Array 26

Figure 4:
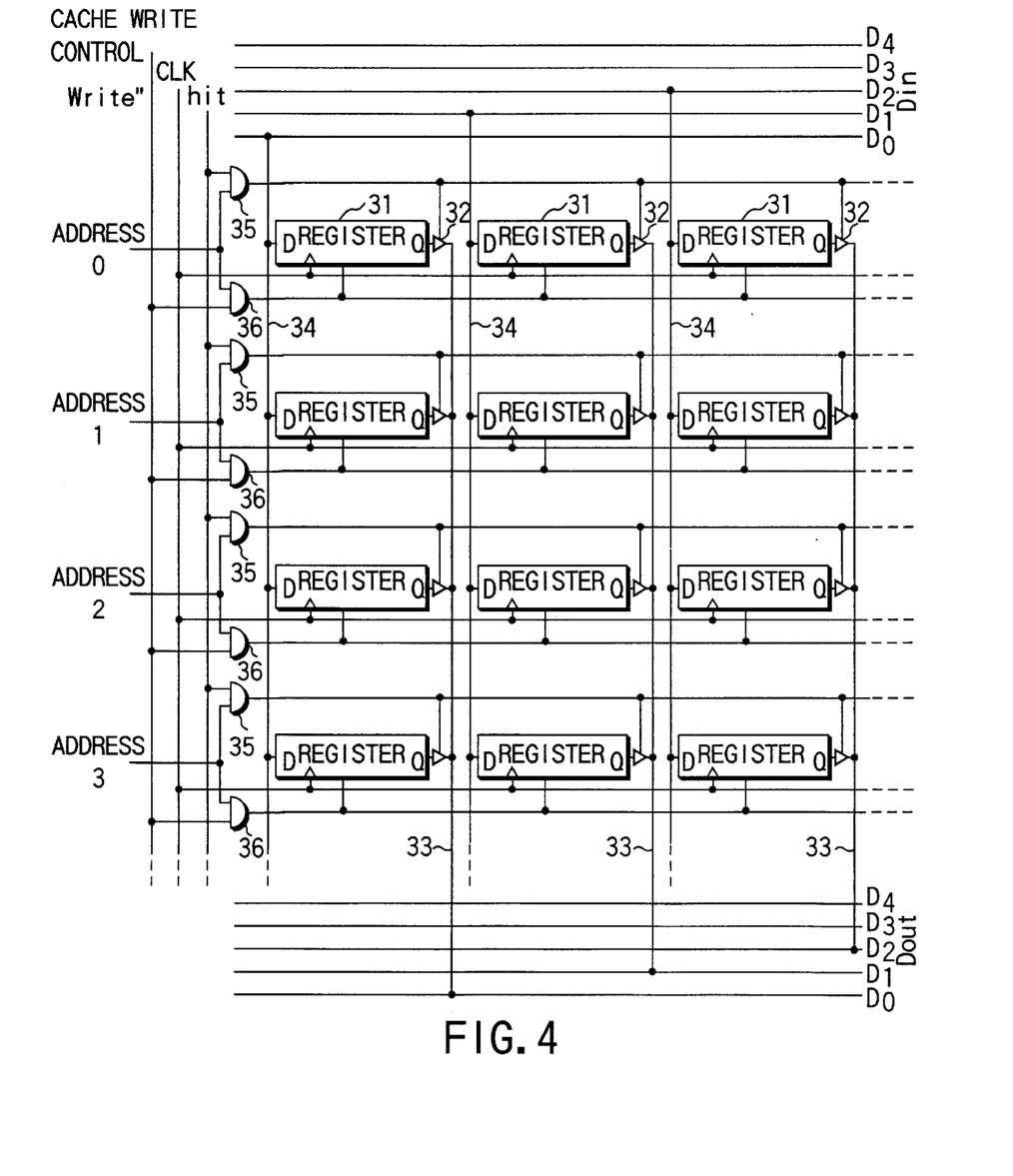
FIG. 4 is a logic circuit diagram showing an example of a data register array of the PBSRAM shown in FIG. 2.

FIG. 4 is a logic circuit diagram showing an example of the data register array 26 shown in FIG. 2.

As shown in FIG. 4, the data register array 26 includes data registers 31 arranged in rows and columns, output buffers 32, first data lines 33, second data lines 34, first AND gate circuits 35, and second AND gate circuits 36.

The data registers 31 each operate in synchronism with the clock signal CLK.

The output buffers 32 are provided at their corresponding output sections (Q) of the data registers 31. Output data Dout ($D_0$ to $D_4$) is output from the output buffers 32 of each column and supplied to the data bus 4 through the corresponding first data line 33, while input data Din ($D_0$ to $D_4$) is input to the data registers 31 of each column from the data bus 4 through the corresponding second data line 34.

The first AND gate circuits 35 are provided in their respective rows of the output buffers 32 and control these circuits 32 for each row. The first AND gate circuits 35 each output an AND of the hit signal HIT and the decoded signal (address 0 to address 3) obtained by decoding the cache address A-cache by means of a decoder (not shown). The output buffers 32 are therefore activated/inactivated for each row.

The second AND gate circuits 36 are provided in their respective rows of the data registers 31 and control these circuits 31 for each row. The second AND gate circuits 36 each output an AND of the cache write control signal WRITE" and the decoded signal (address 0 to address 3). The writing of the data registers 31 is therefore controlled in common with the respective rows.

The data register array 26 illustrated in FIG. 4 basically operates as described below.

When the data register array receives the hit signal HIT, the output buffers 32 of a row selected by the decoded signal (address 0 to address 3) are activated/inactivated. If the output buffers 32 are activated, the output data Dout ($D_0$ to $D_4$) is supplied to the data bus 4 via the first data line 33 and then an external input/output bus (not shown).

When the data register array receives the cache write control signal WRITE", the writing of data registers 31 of a row selected by the decoded signal (address 0 to address 3) is controlled. Input data Din ($D_0$ to $D_4$) is supplied to the controlled data registers 31 from the data bus through the second data line 34 and written thereto.

The write and read operations of the PBSRAM shown in FIG. 2 will now be described with reference to FIGS. 5A to 5E. FIGS. 5A to 5E are views schematically showing data paths of the PBSRAM.

Write Operation

Figure 5A:
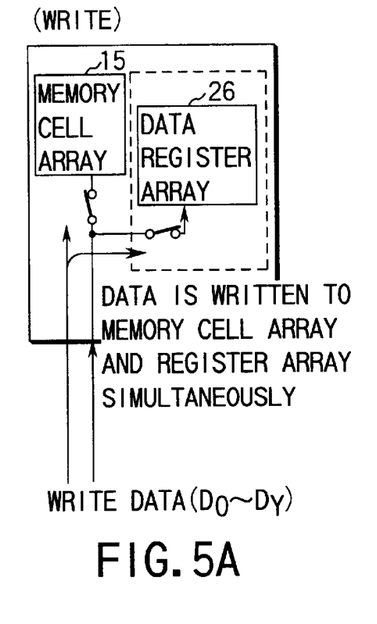
FIGS. 5A to 5E are views schematically showing data paths in write and read modes of the PBSRAM according to the embodiment of the present invention.

The address signals $A_0$ to $A_X$ are input to the memory circuit section 10 from outside. When the address strobe signal ADS and write signal WRITE are asserted, a write operation starts. As shown in FIG. 5A, the input data register 17 receives input data $D_0$ to $D_y$ in response to the memory write control signal WRITE' output from the first write controller 16. After that, the input data $D_0$ to $D_y$ are written to the address of the memory cell array 15 specified by the address signals $A_0(A_0')$ to $A_X$. Simultaneously, the input data $D_0$ to $D_y$ are written to the data register array 26 by the cache second write controller 25.

Figure 5B:
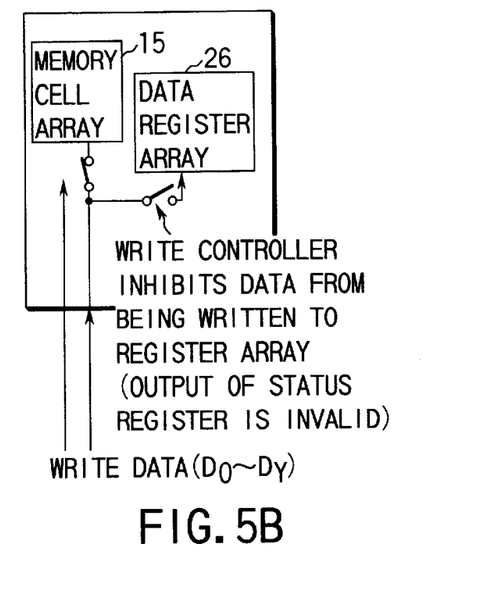

When the status information output from the status register array 22 represents a write operation which is invalidated, the cache write control signal WRITE" becomes inactive. For this reason, as shown in FIG. 5B, data is inhibited from being written to the data register array 26.

Read Operation

The address signals $A_0$ to $A_X$ are input to the memory circuit section 10 from outside. When the address strobe signal ADS is asserted, a read operation starts. In the register array section 20, the comparison circuit 23 compares the tag data and tag address A-tag stored in the tag register array 21 to determine whether they coincide with each other. If they coincide, the comparison circuit 23 generates a hit signal HIT. If not, it generates no hit signals.

Figure 5C:
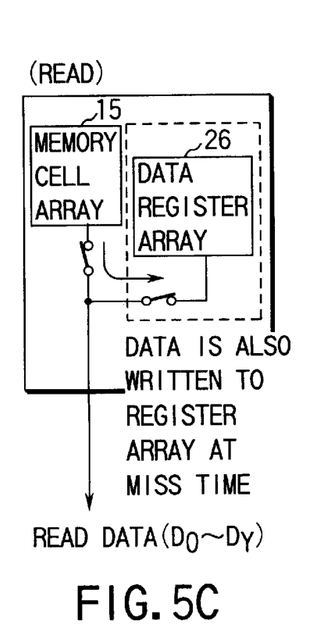
Figure 5D:
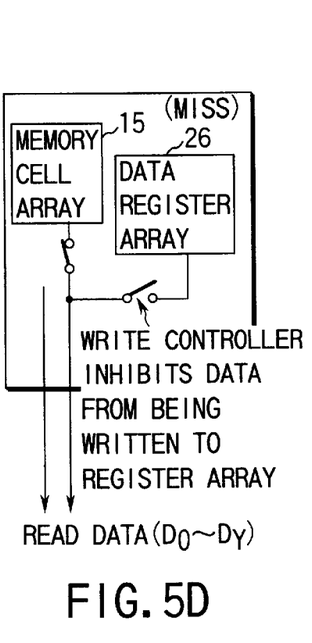
Figure 5E:
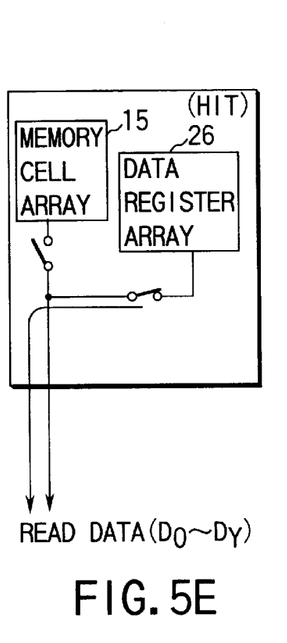

(1) When they coincide (HIT):

As illustrated in FIG. 5E, the hit signal HIT activates the output buffers 32 in the data register array 26 so as to output hit data from the data register array 26. Since, in this case, the output data $D_0$ to $D_y$ are output only in the response time of the output buffers 32, access time is short.

The hit signal HIT inactivates the output enable signal OE and the output buffer 19 in the memory circuit section 10. Thus, the memory circuit section 10 does not output the output data $D_0$ to $D_y$. The hit signal HIT is sent out from the register array section 20 to indicate variations in read latency.

(2) When they do not coincide (MISS):

As illustrated in FIG. 5D, the memory circuit section 10 outputs output data $D_0$ to $D_y$ in the same read latency as that of the prior art.

The output buffers 32 remains inactive. The data register array 26 does not therefore output data $D_0$ to $D_y$.

The cache second write controller 25 of the register array section 20 generates a cache write control signal WRITE" to determine whether data is written to the data register array 26, in response to the hit signal HIT and the status information of the status register array 22.

If the cache write control signal WRITE" is asserted, the output data $D_0$ to $D_y$ output from the memory cell array 15 of the memory circuit section 10 are written to the data register array 26 as they are, as illustrated in FIG. 5C.

Read Latency

The read latency in the read operation of the PBSRAM shown in FIG. 2 will now be described in detail.

Assuming that the access time to the memory circuit section 10 is 6 ns and the access time to the data register array 26 of the register array section 20 is 2 ns, the limit of read latency varies from clock cycle time (clock frequency) to clock cycle time.

(1) If the clock cycle time is 3 ns (clock frequency=333 MHz), the limit of read latency is 4. An operation in this case will be described below.

Figure 6A:
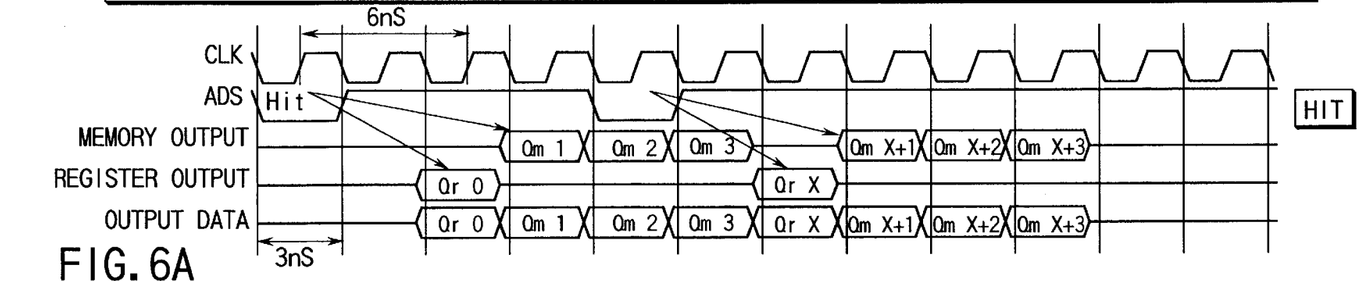
FIGS. 6A to 6C are timing charts showing an example of a read operation of the PBSRAM according to the embodiment of the present invention when clock cycle time is 3 ns (clock frequency=333 MHz)
Figure 7A:
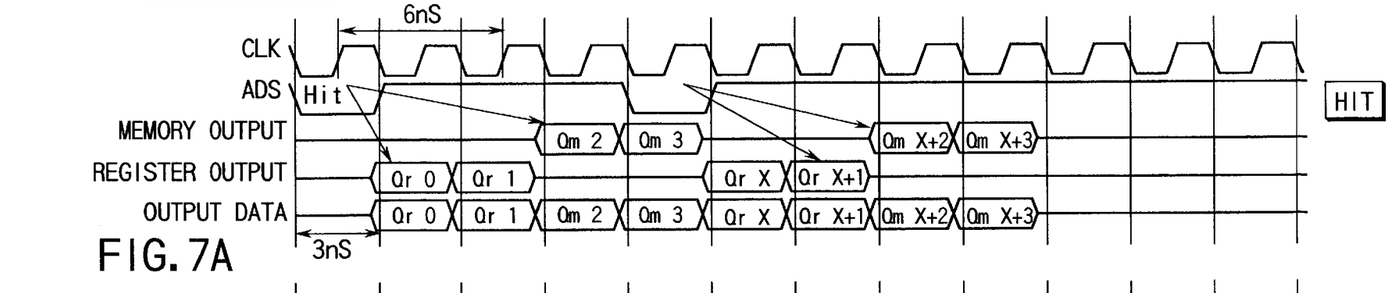
FIGS. 7A to 7C are timing charts showing another example of the read operation of the PBSRAM according to the embodiment of the present invention when clock cycle time is 3 ns (clock frequency=333 MHz)

FIGS. 6A and 7A are timing charts showing the case where data is output from the register array at the hit time and the first access time in the read operation.

As shown in FIG. 6A, the data register array 26 outputs the first output data Qr0 at the hit time of the register array section 20. If the read latency of the data register array 26 is 3 and that of the memory circuit section 10 is 4, the clock number required for the read operation is 3.

In other words, the data register array 26 outputs the first output data Qr0 and, from the next clock, the memory circuit section 10 can output the second to fourth output data Qm1 to Qm3 in sequence. The read latency is therefore 3 in substance.

In contrast, as shown in FIG. 7A, the data register array 26 outputs the first output data Qr0 and the second output data Qr1 at the hit time of the register array section 20. If the read latency of the data register array 26 is 4 and that of the memory circuit section 10 is 2, the clock number required for the read operation is 2 or 3.

In other words, the data register array 26 outputs the first output data Qr0 and the second output data Qr1 and, from the next clock, the memory circuit section 10 can output the third and fourth output data Qm2 and Qm3 in sequence. The read latency is therefore 2 in substance.

(2) If the clock cycle time is 2 ns (clock frequency=500 MHz), the limit of read latency is 5. An operation in this case will be described below.

Figure 6B:
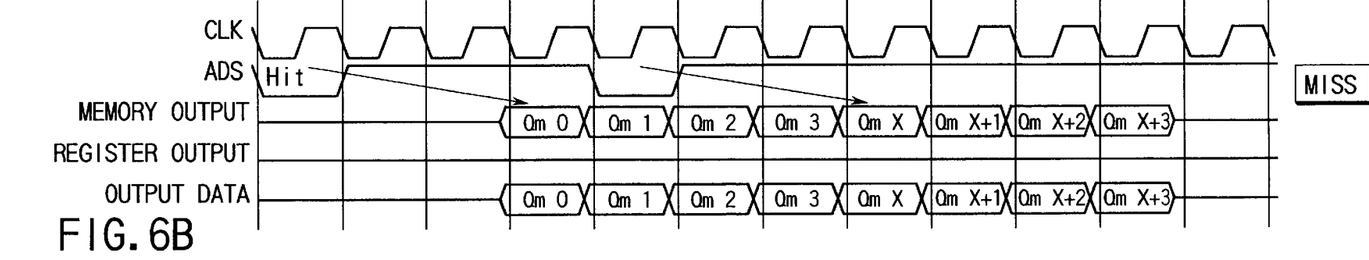
Figure 6C:
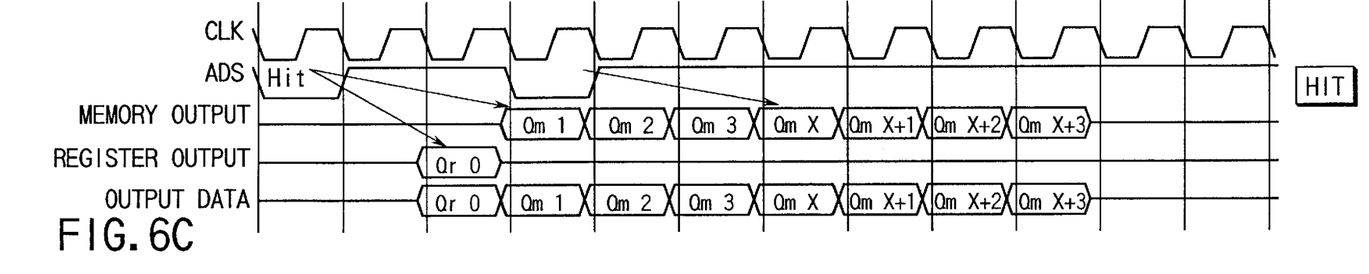
Figure 7B:
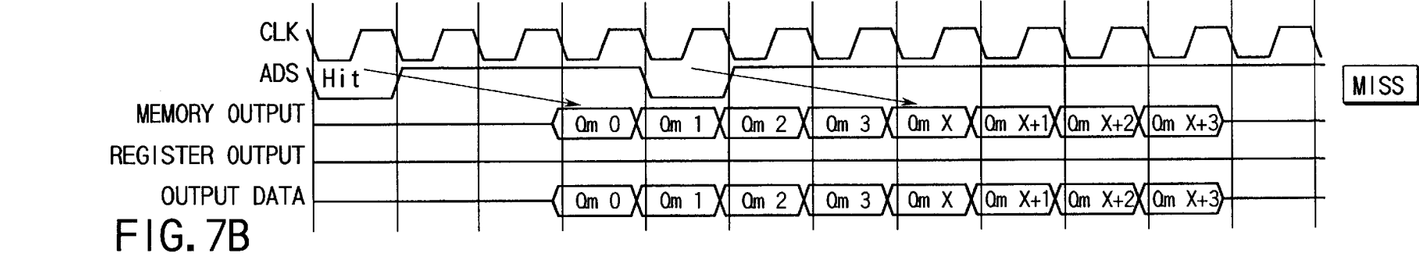
Figure 7C:
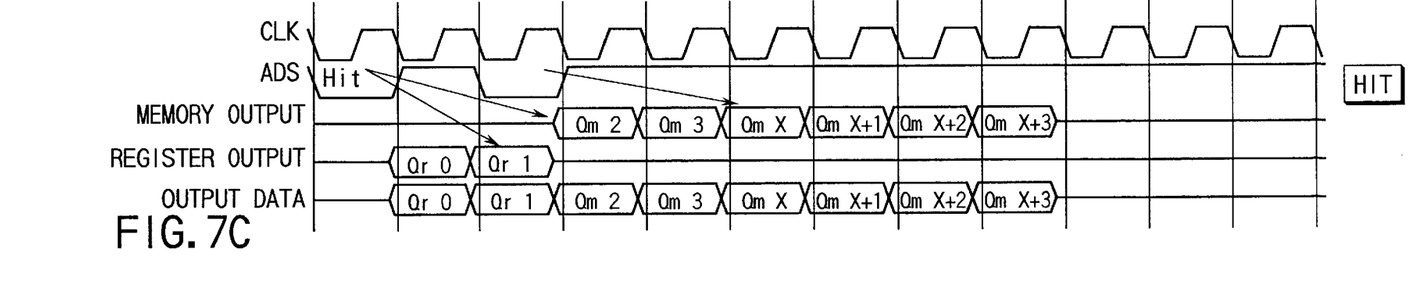

FIGS. 6B and 7B show timing charts at the miss time in the read operation, and FIGS. 6C and 7C show timing charts at the hit time in the read operation, in which when burst addresses are continuous, data is output from the register array at the first access time and then data is output from the memory.

Figure 8A:
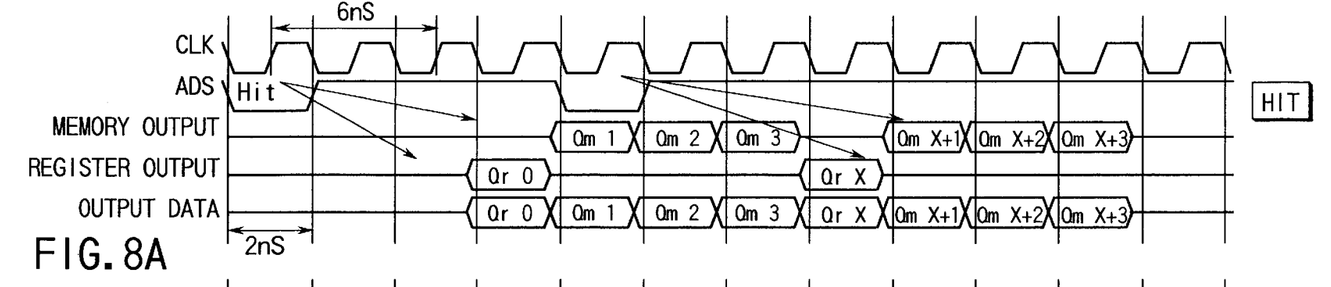
FIGS. 8A to 8C are timing charts showing an example of a read operation of the PBSRAM according to the embodiment of the present invention when clock cycle time is 2 ns (clock frequency=500 MHz)
Figure 9A:
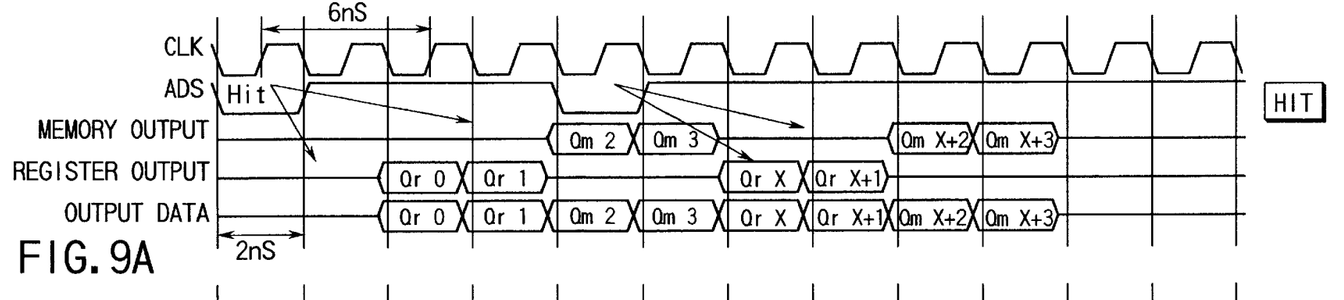
FIGS. 9A to 9C are timing charts showing another example of the read operation of the PBSRAM according to the embodiment of the present invention when clock cycle time is 2 ns (clock frequency=500 MHz)
Figure 10A:
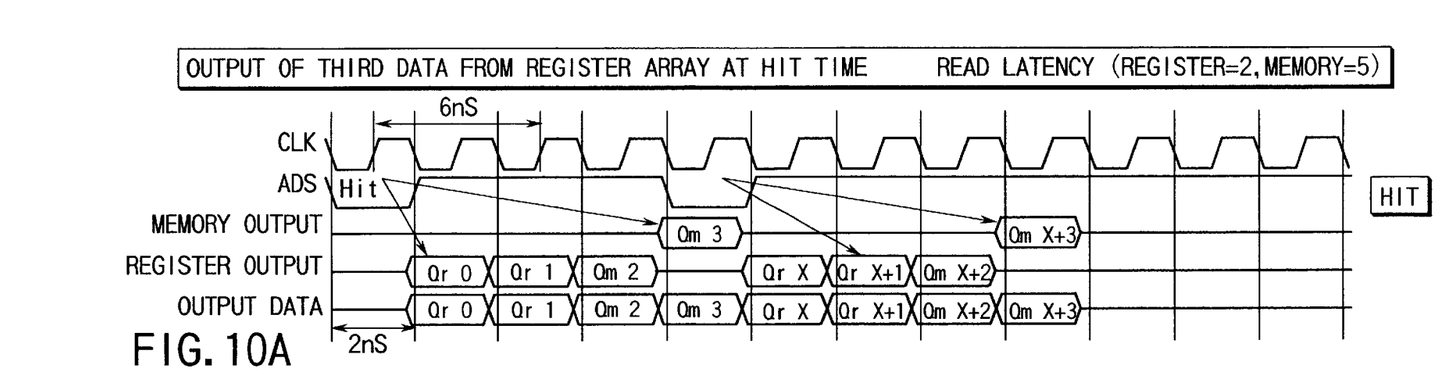
FIGS. 10A to 10C are timing charts showing still another example of the read operation of the PBSRAM according to the embodiment of the present invention when clock cycle time is 2 ns (clock frequency=500 MHz).

FIGS. 8A, 9A and 10A show timing charts at the hit time in the read operation, in which output data is output from the register array at the first access time.

As shown in FIG. 8A, the data register array 26 outputs the first output data Qr0 at the hit time of the register array section 20. If the read latency of the data register array 26 is 4 and that of the memory circuit section 10 is 5, the clock number required for the read operation is 4.

In other words, the data register array 26 outputs the first output data Qr0 and, from the next clock, the memory circuit section 10 can output the second to fourth output data Qm1 to Qm3 in sequence. The read latency is therefore 4 in substance.

In contrast, as shown in FIG. 9A, the data register array 26 outputs the first output data Qr0 and the second output data Qr1 at the hit time of the register array section 20. If the read latency of the data register array 26 is 3 and that of the memory circuit section 10 is 5, the clock number required for the read operation is 3 or 4.

In other words, the data register array 26 outputs the first output data Qr0 and the second output data Qr1 and, from the next clock, the memory circuit section 10 can output the third and fourth output data Qm2 and Qm3 in sequence. The read latency is therefore 3 in substance.

In contrast, as shown in FIG. 10A, the data register array 26 outputs the first to third output data Qr0 to Qr2 at the hit time of the register array section 20. If the read latency of the data register array 26 is 2 and that of the memory circuit section 10 is 5, the clock number required for the read operation is 3 or 4.

In other words, the data register array 26 outputs the first to third output data Qr0 to Qr2 and, from the next clock, the memory circuit section 10 can output the third and fourth output data Qm2 and Qm3 in sequence. The read latency is therefore 2 in substance.

Figure 8B:
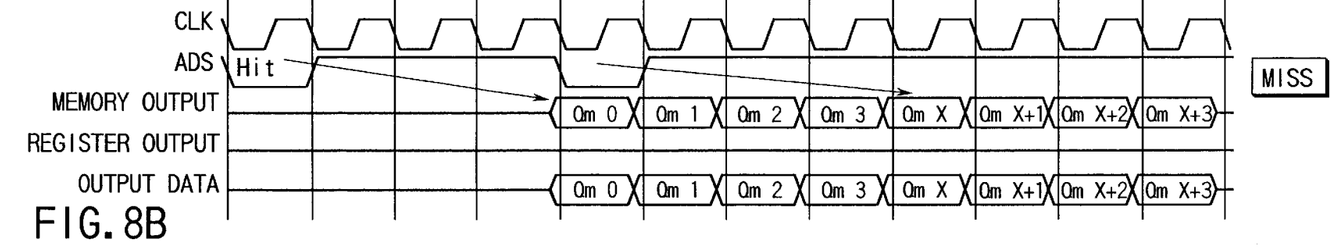
Figure 9B:
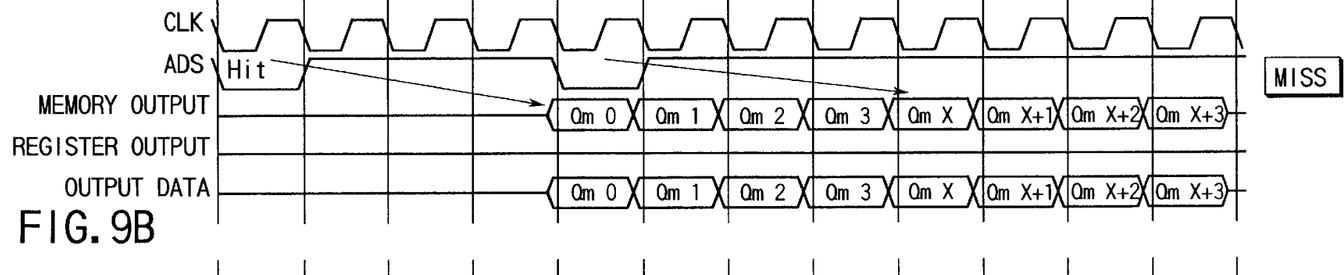
Figure 10B:
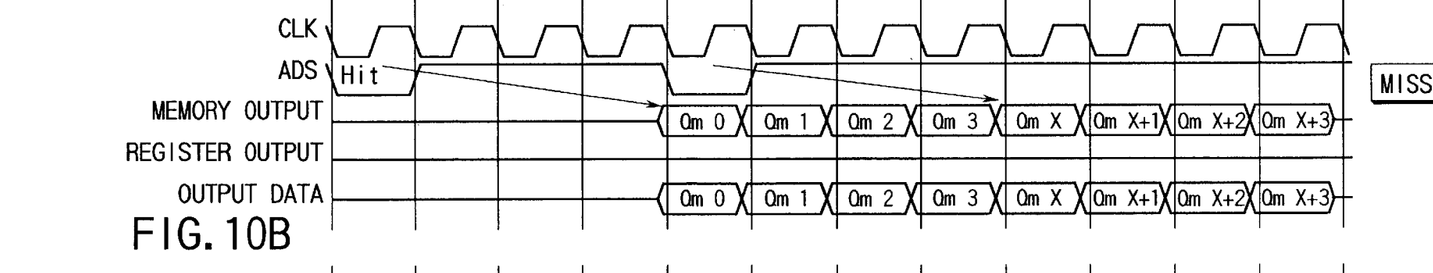

FIGS. 8B, 9B and 10B show timing charts at the miss time in the read operation.

Figure 8C:
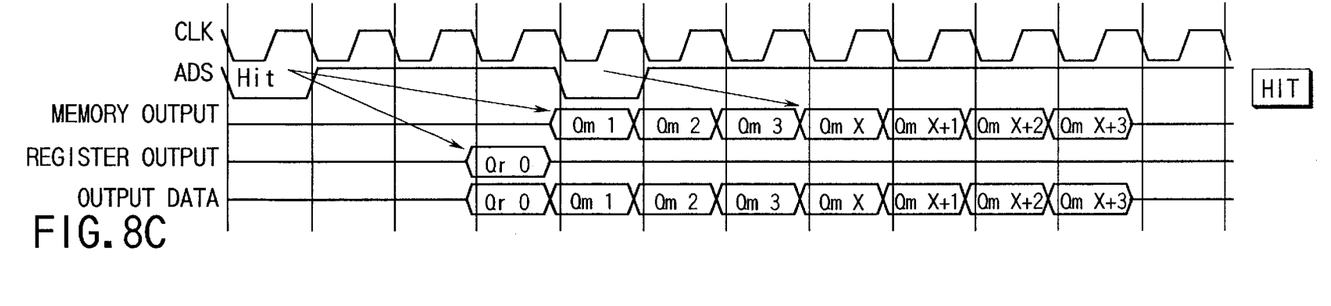
Figure 9C:
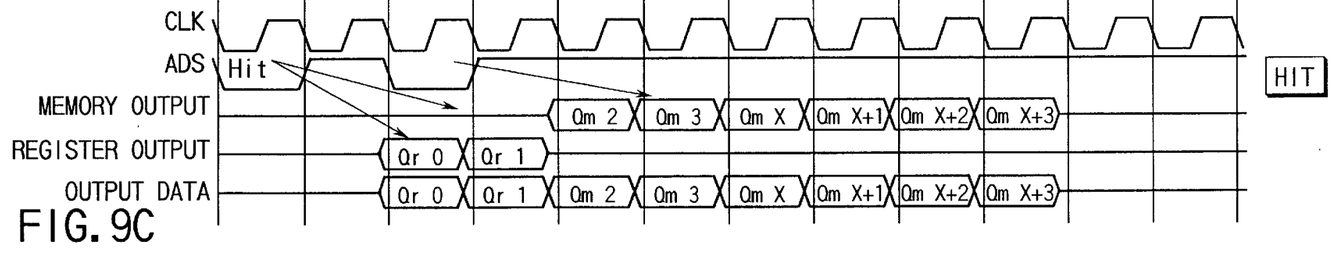
Figure 10C:
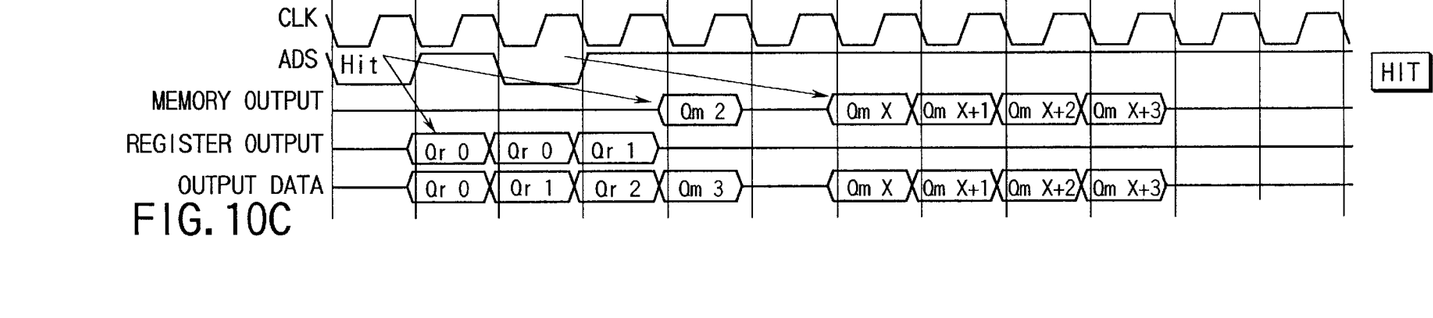

FIGS. 8C, 9C and 10C show timing charts at the hit time in the read operation, in which when burst addresses are continuous, data is output from the register array at the first access time and then data is output from the memory.

It is seen from the timing charts shown in FIGS. 6A to 10C that a memory having the same read latency can be achieved even though the clock cycle time is made short (the clock frequency is made higher) than that in the prior art PBSRAM.

According to the present invention described above, there can be provided a semiconductor memory which is suitably used as a high-speed cache memory and capable of improving the efficiency of use of a data bus by shortening the read latency in a synchronous burst memory capable of performing an address pipeline operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:

a synchronous burst memory circuit section capable of performing an address pipeline operation; and a register array section constituting a cache memory in an address space of the synchronous burst memory circuit section, the register array section including a tag register array and a data register array, address signals, which are to be supplied to a memory cell array in the synchronous burst memory circuit section, being distributed to a tag address and a cache address of the tag register array, and the cache address is supplied to the data register array.

2. The semiconductor integrated circuit device according to claim 1, wherein wiring is formed between the synchronous burst memory circuit section and the register array section, and the wiring including:

a tag address bus for transferring the tag address;

a cache address bus for transferring the cache address;

a data bus for transferring data between the synchronous burst memory circuit section and the register array section; and a write control signal line for transferring a write control signal from the synchronous burst memory circuit section to the register array section.

3. The semiconductor integrated circuit device according to claim 1, wherein the tag register array stores the tag address, using the cache address as an address input, and outputs the stored tag address based on an input cache address, and the data register array stores data, using the cache address as an address input, and outputs the stored data based on the inputted cache address.

4. The semiconductor integrated circuit device according to claim 3, wherein the tag register array and the data register array each operate in synchronization with a clock signal.

5. The semiconductor integrated circuit device according to claim 3, wherein the register array section has a status register array for storing status information corresponding to the cache address and outputting the stored status information based on the input cache address, a comparator for comparing the input tag address and the tag address output from the tag register array and generating a hit signal when the inputted tag address and the output tag address coincide with each other, a determination circuit for determining whether the hit signal is effective or not based on the status information, and a write controller for generating a cache write control signal for controlling a write operation for the data register array based on the hit signal, the status information and the write control signal input from the write control signal line.

6. The semiconductor integrated circuit device according to claim 5, wherein the status register array operates in synchronization with the clock signal.

7. The semiconductor integrated circuit device according to claim 5, wherein a read latency of the register array section is shorter than a read latency of the synchronous burst memory circuit section.

8. The semiconductor integrated circuit device according to claim 7, wherein the data register array outputs data when the hit signal is generated.

9. The semiconductor integrated circuit device according to claim 8, wherein data is output from the memory cell array instead of the data register array after a lapse of the read latency of the synchronous burst memory circuit section.

10. The semiconductor integrated circuit device according to claim 9, further comprising:
    a binary counter, which increments the address signal based on the hit signal and supplies the incremented address signal to the memory cell array.

11. The semiconductor integrated circuit device according to claim 10, wherein the binary counter increments the address signal corresponding to a difference between the read latency of the register array and the read latency of the synchronous burst memory circuit section.

12. The semiconductor integrated circuit device according to claim 2, wherein the data register array includes:
    data registers arranged in rows and columns and each operating in synchronization with a clock signal;
    output buffers provided in a succeeding stage so as to correspond to the data registers, respectively;
    a plurality of first data lines for supplying output data from the output buffers of each column to the data bus;
    a plurality of second data lines for supplying input data from the data bus to the data registers of each column;
    a plurality of first AND gates provided in respective rows of the output buffers, for outputting an AND of a decoded signal of the cache address and a hit signal generated from the hit signal generation circuit, and activating/inactivating the output buffers of a row corresponding to the AND; and
    a plurality of second AND gates provided in respective rows of the data registers, for outputting an AND of the decoded signal and a cache write control signal supplied from the cache write controller, and writing data to the data registers of a row corresponding to the AND.

13. The semiconductor integrated circuit device according to claim 1, wherein the synchronous burst memory circuit section is connected to one of a CPU and a cache controller and employed as a data memory of a cache memory controlled by the cache controller.

* * * * *